United States Patent
Lee et al.

(10) Patent No.: US 10,175,800 B2
(45) Date of Patent: Jan. 8, 2019

(54) ELECTRODE MEMBER AND TOUCH WINDOW COMPRISING THE SAME

(71) Applicant: LG INNOTEK CO., LTD., Seoul (KR)

(72) Inventors: Young Jae Lee, Seoul (KR); Hyun Seok Lim, Seoul (KR); Soo Kwang Yoon, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 40 days.

(21) Appl. No.: 15/504,099

(22) PCT Filed: Oct. 1, 2015

(86) PCT No.: PCT/KR2015/010410
§ 371 (c)(1),
(2) Date: Feb. 15, 2017

(87) PCT Pub. No.: WO2016/053036
PCT Pub. Date: Apr. 7, 2016

(65) Prior Publication Data
US 2017/0277322 A1    Sep. 28, 2017

(30) Foreign Application Priority Data
Oct. 1, 2014    (KR) .................. 10-2014-0132472

(51) Int. Cl.
| | | |
|---|---|---|
| G06F 3/041 | (2006.01) | |
| G06F 3/044 | (2006.01) | |
| G02F 1/1333 | (2006.01) | |
| G02F 1/1343 | (2006.01) | |
| H01L 27/32 | (2006.01) | |

(52) U.S. Cl.
CPC ............ *G06F 3/0412* (2013.01); *G06F 3/044* (2013.01); *G02F 1/13338* (2013.01); *G02F 1/13439* (2013.01); *G06F 2203/04102* (2013.01); *G06F 2203/04103* (2013.01); *G06F 2203/04112* (2013.01); *H01L 27/323* (2013.01); *H01L 27/3244* (2013.01)

(58) Field of Classification Search
None
See application file for complete search history.

(56) References Cited

U.S. PATENT DOCUMENTS

| | | | |
|---|---|---|---|
| 2011/0227858 A1* | 9/2011 | An ...................... | G06F 3/044 345/174 |
| 2013/0122251 A1 | 5/2013 | Matsumoto et al. | |

(Continued)

FOREIGN PATENT DOCUMENTS

| | | |
|---|---|---|
| KR | 2014-0049310 | 4/2014 |
| KR | 10-1413637 | 7/2014 |
| WO | WO 2013-119032 | 8/2013 |

OTHER PUBLICATIONS

International Search Report dated Feb. 4, 2016 issued in Application No. PCT/KR2015/010410.

*Primary Examiner* — Joseph Haley
*Assistant Examiner* — Emily Frank
(74) *Attorney, Agent, or Firm* — KED & Associates, LLP

(57) ABSTRACT

An electrode member according to an embodiment includes a first resin layer; and an electrode layer on the first resin layer, wherein the first resin layer has a thickness in the range of 1 μm to 25 μm.

18 Claims, 3 Drawing Sheets

(56) References Cited

U.S. PATENT DOCUMENTS

2013/0129465 A1     5/2013   Okazaki et al.
2013/0307565 A1   11/2013   Ra et al.
2014/0035860 A1     2/2014   Wong

* cited by examiner

[Fig. 1]
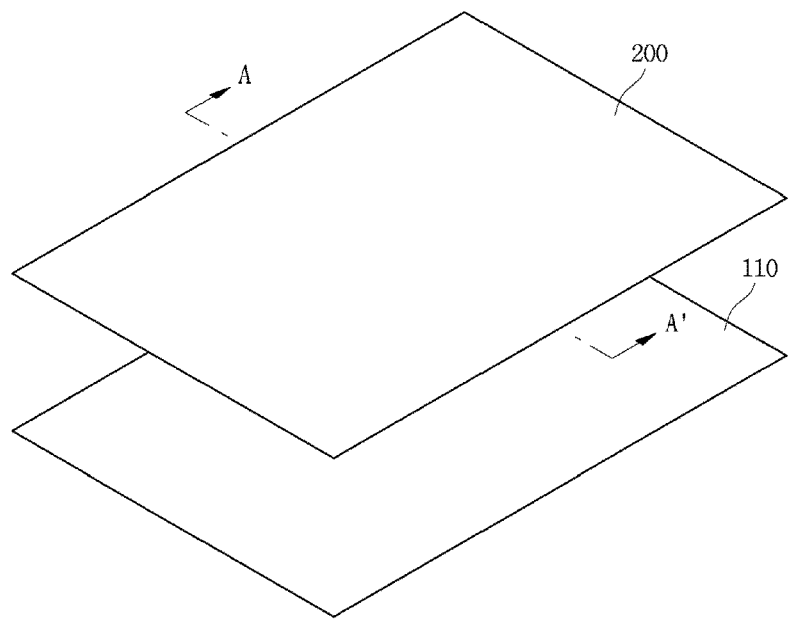
[Fig. 2]
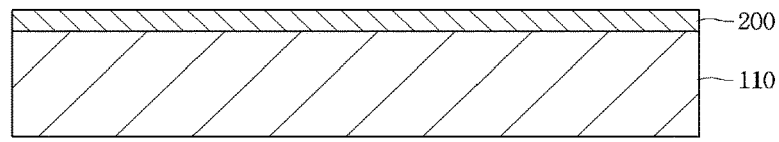
[Fig. 3]
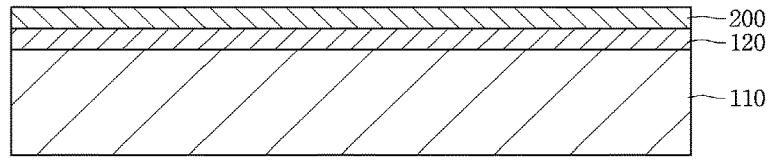
[Fig. 4]
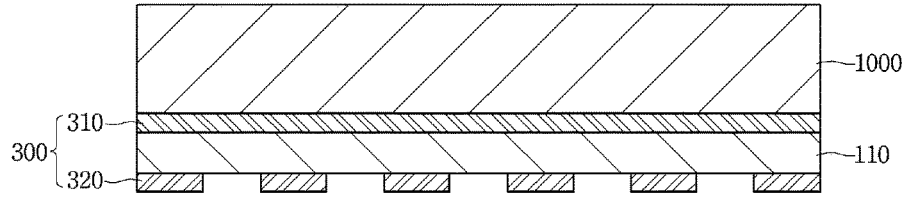
[Fig. 5]
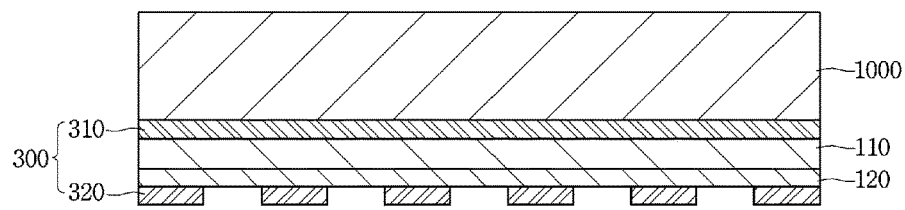

[Fig. 6]
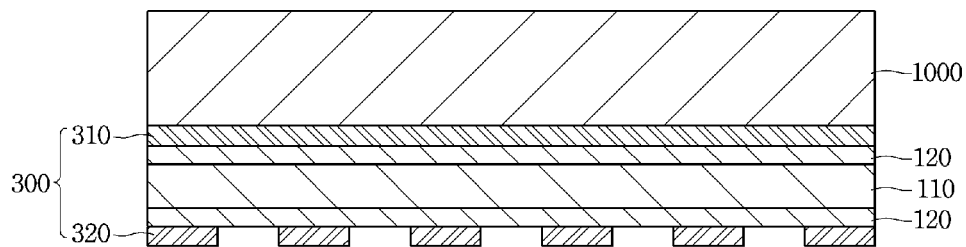
[Fig. 7]
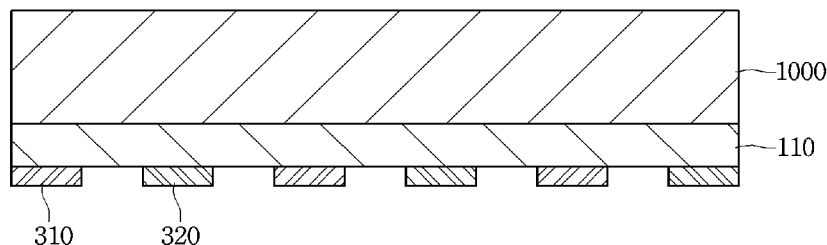
[Fig. 8]
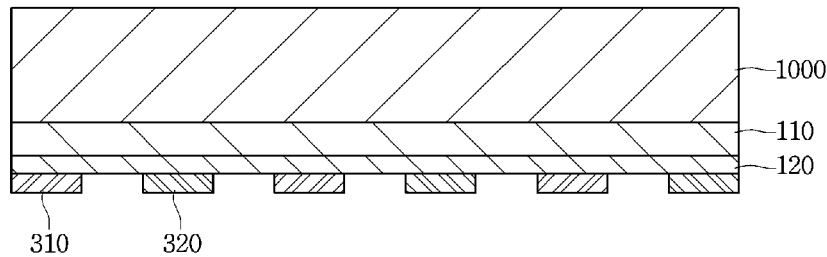
[Fig. 9]
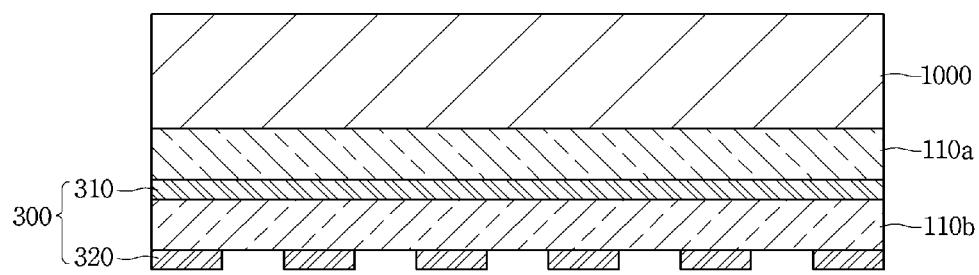
[Fig. 10]
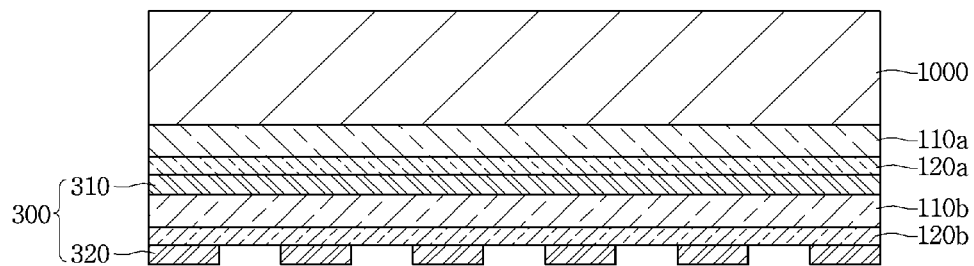

[Fig. 11]
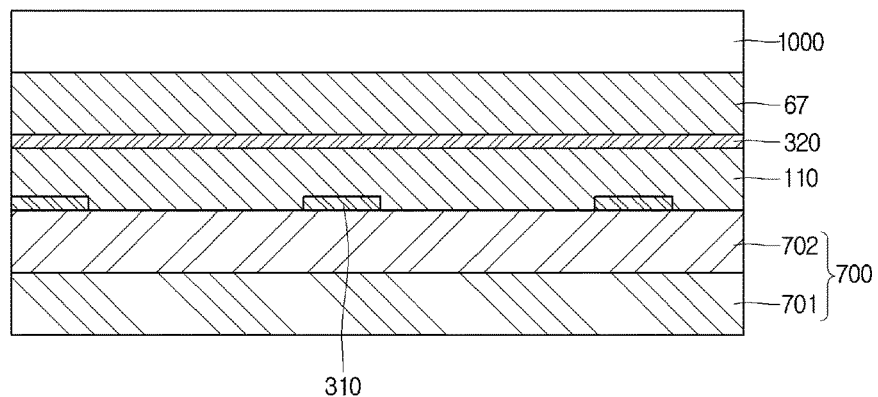
[Fig. 12]
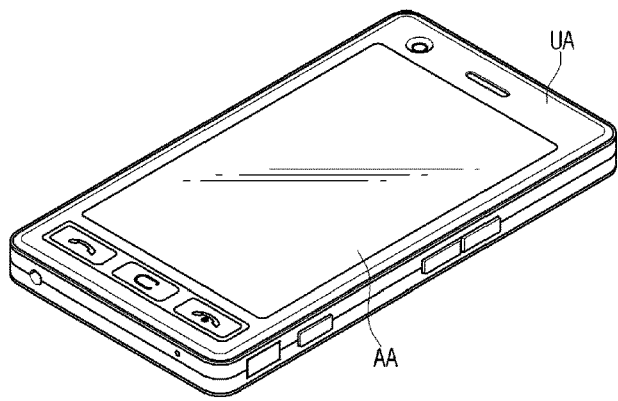
[Fig. 13]
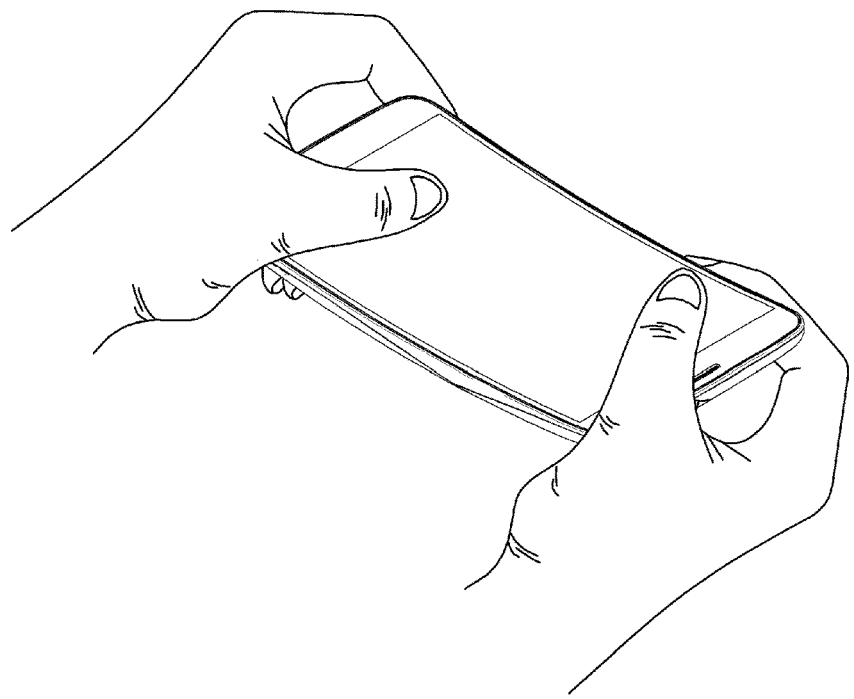

ELECTRODE MEMBER AND TOUCH WINDOW COMPRISING THE SAME

CROSS-REFERENCE TO RELATED PATENT APPLICATIONS

This application is a U.S. National Stage Application under 35 U.S.C. § 371 of PCT Application No. PCT/KR2015/010410, filed Oct. 1, 2015, which claims priority to Korean Patent Application No. 10-2014-0132472, filed Oct. 1, 2014, whose entire disclosures are hereby incorporated by reference.

TECHNICAL FIELD

The embodiment relates to an electrode member and a touch window comprising the same.

BACKGROUND ART

Recently, a touch window, which performs an input function through the touch of an image displayed on a display device by an input device, such as a stylus pen or a finger, has been applied to various electronic appliances.

The touch window may be typically classified into a resistive touch window and a capacitive touch window. In the resistive touch window, a glass and an electrode are short circuited with each other due to a pressure applied thereto, so that the position of a touch point is detected. In the capacitive touch window, the position of the touch point is detected by sensing the variation of capacitance between electrodes when a finger of the user touches the capacitive touch window.

As the resistive touch window is repeatedly used, the performance of the resistive touch window may be degraded and scratch may occur in the resistive touch window. Thus, the capacitive touch window with superior durability and long life span has been spotlighted.

Such a touch window may be formed by disposing an electrode on a substrate. However, due to a thickness of the substrate, an overall thickness of the touch window may be increased.

Therefore, there is a need to provide a touch window having a new structure which may reduce the thickness of a touch window.

DISCLOSURE OF INVENTION

Technical Problem

The embodiment is to provide an electrode member, a thickness of which is reduced and a touch window comprising the same.

Solution to Problem

According to one embodiment, there is provided an electrode member which includes a first resin layer and an electrode layer on the first resin layer, wherein the first resin layer has a thickness in the range of 1 μm to 25 μm.

Advantageous Effects of Invention

According to the embodiment, the overall thickness of the electrode member and the touch window may be reduced.

That is, after a substrate for supporting the electrode is removed, the electrode is directly disposed on the resin layer having an adhesive property, or after another resin layer for supporting the electrode is disposed on the resin layer, the electrode is disposed on the another resin layer, so that the overall thickness of the electrode member and the touch window may be reduced as much as the thickness of the removed substrate.

Thus, the overall thickness of the electrode member and the touch window according to the embodiment may be reduced, so that the size restriction in the touch device to which the electrode member and the touch window are applied may be relieved, thereby implementing a touch device having a lighter weight and a thinner thickness.

In addition, since the support for supporting the electrode has an adhesive property, a wearable touch may be readily implemented.

BRIEF DESCRIPTION OF DRAWINGS

FIG. 1 is a brief perspective view showing an electrode member according to a first embodiment.

FIG. 2 is one sectional view taken along line A-A' of FIG. 1.

FIG. 3 is another sectional view taken along line A-A' of FIG. 1.

FIG. 4 is a sectional view showing a touch window according to the first embodiment.

FIG. 5 is another sectional view showing the touch window according to the first embodiment.

FIG. 6 is still another sectional view showing the touch window according to the first embodiment.

FIG. 7 is one sectional view showing a touch window according to a second embodiment.

FIG. 8 is another sectional view showing the touch window according to the second embodiment.

FIG. 9 is one sectional view showing a touch window according to a third embodiment.

FIG. 10 is another sectional view showing the touch window according to the third embodiment.

FIG. 11 is a view showing a touch device formed by coupling a touch window and a display panel to each other according to an embodiment.

FIGS. 12 to 15 are views showing various examples of a touch device to which a touch window according to an embodiment is applied.

MODE FOR THE INVENTION

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

In the following description, when a part is connected to the other part, the parts are not only directly connected to each other, but also indirectly connected to each other while interposing another part therebetween. In addition, when a predetermined part "includes" a predetermined component, the predetermined part does not exclude other components, but may further include other components unless otherwise indicated.

The thickness and size of each layer (or film), each region, each pattern, or each structure shown in the drawings may be modified for the purpose of convenience or clarity of the explanation. In addition, the size of elements does not utterly reflect an actual size.

Hereinafter, an embodiment will be described in detail with reference to accompanying drawings.

Referring to FIGS. 1 to 3, an electrode member according to the embodiment may include a first resin layer 110, and an electrode layer 200 on the first resin layer 110.

The first resin layer 110 may support the electrode layer 200. The first resin layer 110 may be an adhesive layer. That is, the first resin layer 110 may have an adhesive property. IN addition, the first resin layer 110 may be transparent. For example, the first resin layer 100 may be an optical clear adhesive (OCA) layer.

Thus, the electrode layer 200 may be disposed on one surface of the first resin layer 110 and an opposite surface of the first resin layer 110 may adhere to a member.

The first resin layer 110 may have a thickness in the range of about 1 μm to about 100 μm. In detail, the first resin layer 110 may have a thickness in the range of about 1 μm to about 25 μm. In more detail, the first resin layer 110 may have a thickness in the range of about 4 μm to about 25 μm.

It is difficult in terms of the fabrication process to implement the first resin layer 110 having a thickness less than about 1 μm and the process efficiency may be deteriorated. When the thickness of the first resin layer 110 exceeds about 25 μm, the overall thickness of the electrode member may be increased.

The electrode layer 200 may be disposed on the first resin layer 110. In detail, the electrode layer 200 may be disposed on at least one of both surfaces of the first resin layer 110.

The electrode layer 200 may be directly disposed on the first resin layer 110. That is, the electrode layer 200 may be disposed while making contact with the first resin layer 110.

The electrode layer 200 may include a sensing electrode and a wire electrode. In detail, the electrode layer 200 may include the sensing electrode for sensing the variation in capacitance due to the touch of a finger, and the wire electrode connected to the sensing electrode to transmit the variation in capacitance sensed by the sensing electrode to a circuit board.

In addition, the electrode layer 200 may various conductive materials.

For example, the electrode layer 200 may include a transparent conductive material such that electricity may flow therethrough without interrupting transmission of light. For example, the electrode layer 200 may include metal oxide such as indium tin oxide, indium zinc oxide, copper oxide, tin oxide, zinc oxide or titanium oxide. Thus, since the transparent material is disposed on a sensing active area, the degree of freedom in forming the pattern of a sensing electrode may be improved.

In addition, the electrode layer 200 may include a nanowire, a photosensitive nanowire film, a carbon nanotube (CNT), grapheme, conductive polymer or a mixture thereof. Thus, when a flexible and/or bendable touch window is fabricated, the degree of freedom may be improved.

If a nano composite, such as a nano wire or CNT, is used, the electrode layer may be formed in black. In this case, it is possible to control the color and the reflectivity while ensuring electric conductivity by controlling the content of nano powder.

In addition, the electrode layer 200 may include various metals. For example, the sensing electrode or the wire electrode may include at least one of Cr, Ni, Cu, Al, Ag, Mo, Au, Ti and an alloy thereof. Thus, when a flexible and/or bendable touch window is fabricated, the degree of freedom may be improved.

In addition, the electrode layer 200 may be formed in a mesh shape. In detail, the electrode layer 200 may a plurality of sub-electrodes. The sub-electrodes are disposed in a mesh shape while crossing each other, so that the electrode layer 200 may be formed in a mesh shape.

For example, after a base resin layer is disposed on the first resin layer 110 and a conductive material is directly deposited on the base resin layer, the conductive material may be etched to form the electrode layer having a mesh shape. Differently from the above, after a concave or convex pattern having a mesh shape is formed, a conductive material is filled in or deposited on the pattern to form the electrode layer having a mesh shape.

The electrode layer may include mesh lines and mesh opening parts between the mesh lines formed by the sub-electrodes. In this case, a line width of the mesh line may be in the range of about 0.1 μm to about 10 μm. It may be impossible in terms of the fabrication process to form the mesh line LA having a line width less than about 0.1 μm. When the line width of the mesh line LA exceeds about 10 μm, the sensing electrode pattern may be viewed from an outside, so that the visibility may be degraded. The mesh line LA may have a line width in the range of about 1 μm to about 5 μm. Alternatively, the mesh line LA may have a line width in the range of about 1.5 μm to about 3 μm.

The mesh opening part OA may be formed in various shapes. For example, the mesh opening part OA may have various shapes such as a polygonal shape including a rectangular shape, a diamond shape, a pentagon shape or a hexagonal shape, or a circular shape. In addition, the mesh opening part OA may have a regular or random shape.

In addition, the mesh line may have a thickness in the range of about 100 nm to about 500 nm. When the thickness of the mesh line is less than about 100 nm, the electrode resistance may be increased so that the electrical property may be deteriorated. When the thickness of the mesh line exceeds about 500 nm, the overall thickness of the electrode member may be thickened, so that the process efficiency may be deteriorated. Preferably, the thickness of the mesh line may be in the range of about 150 nm to about 200 nm. More preferably, the thickness of the mesh line may be in the range of about 180 nm to about 200 nm.

The electrode layer may have a mesh shape, so that the pattern of the electrode layer may not be viewed on the active area AA, for example, a display area. That is, even though the electrode layer is formed of metal, the electrode layer may not be viewed. In addition, even though the electrode layer is applied to a large-size touch window, the resistance of the touch window may be lowered.

FIG. 3 is another sectional view of the electrode member according to the embodiment.

Referring to FIG. 3, an electrode member according to another embodiment may include a first resin layer 110, a second resin layer 120 and an electrode layer 200.

The first resin 110 may have the same property as that of the resin layer described above. That is, the first resin layer 110 may have an adhesive property. The first resin layer 110 may support the second resin layer 120 and the electrode layer 200.

The first resin layer 110 may have a thickness in the range of about 1 μm to about 100 μm. In detail, the first resin layer 110 may have a thickness in the range of about 1 μm to about 25 μm. In more detail, the first resin layer 110 may have a thickness in the range of about 4 μm to about 25 μm.

It is difficult to implement in terms of the fabrication process the first resin layer 110 having a thickness less than about 1 μm and the process efficiency may be deteriorated. When the thickness of the first resin layer 110 exceeds about 25 μm, the overall thickness of the electrode member may be increased.

The second resin layer 120 may be disposed on the first resin layer 110 and support the electrode layer 200. For example, the second resin layer 120 may be interposed between the first resin layer 110 and the electrode layer 200. The electrode layer 200 may be more easily disposed on the first resin layer 110 due to the second resin layer 120 and the adhesive strength of the electrode layer 200 may be improved, so that the electrode layer 200 may be prevented from being delaminated.

The first and second resin layers 110 and 120 may include mutually different materials. The second resin layer 120 may include photo-curable resin or thermosetting resin. For example, the second resin layer 120 may include acrylic or urethane-based copolymer. For example, the second resin layer 120 may include UV resin.

Thus, the adhesive strength of the electrode layer 200 disposed on the second resin layer 120 may be improved so that the reliability of the electrode member may be improved.

The first and second resin layers 110 and 120 may have mutually different thicknesses. In detail, the second resin layer 120 may have a thickness thinner than that of the first resin layer 110.

For example, the second resin layer 120 may be disposed to have the thickness of about 10 μm. In detail, the second resin layer 120 may be disposed to have a thickness in the range of about 1 μm to about 10 μm. It may be difficult in terms of the fabrication process to allow the second resin layer 120 to be formed at a thickness less than about 1 μm, and when the thickness of the second resin layer 120 exceeds about 10 μm, the overall thickness of the electrode member may be increased.

In addition, the strengths of the first and second resin layers 110 and 120 may be different from each other. For example, the strength of the second resin layer 120 may be greater than that of the first resin layer 110. Thus, when the electrode layer 200 is disposed on the first and second resin layers 110 and 120 and patterned, the electrode layer 200 may be more effectively patterned so that the reliability of the electrode member may be improved.

According to the embodiments, the thickness of the electrode member may be reduced. That is, after the substrate for supporting the electrode is removed, the electrode is directly disposed on the resin layer, or after the second resin layer is disposed on the first resin layer, the electrode layer is disposed on the second resin layer, so that the overall thickness of the electrode member may be reduced as much as the thickness of the removed substrate.

Thus, the overall thickness of the electrode member according to the embodiment may be reduced, so that the size restriction in the touch device to which the electrode member is applied may be relieved, thereby implementing a touch device having a lighter weight and a thinner thickness.

In addition, since the support for supporting the electrode has an adhesive property, after a protective film adheres onto one surface of the resin layer, the electrode member may be easily applicable to clothes, shoes, or an accessory of clothes, glasses or a clock, so that a wearable touch may be readily implemented.

Hereinafter, a touch window to which the electrode member according to the embodiments described above is applied will be described with reference to FIGS. 4 to 10. In the following description of the touch window, description about elements and structures the same as or similar to that of the electrode member described above will be omitted.

Referring to FIG. 4, a touch window according to the first embodiment may include a cover substrate 1000, a first resin layer 110, a sensing electrode 300 and a wire electrode.

The cover substrate 1000 may be rigid or flexible. For example, the cover substrate 1000 may include chemically tempered/semi-tempered glass, such as soda lime glass or aluminosilicate glass, reinforced or flexible plastic, such as polyimide (PI), polyethylene terephthalate (PET), propylene glycol (PPG) or polycarbonate (PC), or sapphire.

In addition, the cover substrate 1000 may include an optical isotropic film. For example, the cover substrate 1000 may include cyclic olefin copolymer (COC), cyclic olefin polymer (COP), optical isotropic polycarbonate (PC), or optical isotropic polymethyl methacrylate (PMMA).

The sapphire has superior electric characteristics, such as permittivity, so that a touch response speed may be greatly increased and a space touch such as hovering may be easily implemented. In addition since the sapphire has a high surface hardness, the sapphire is applicable to a cover substrate. The hovering signifies a technique for recognizing a coordinate even in a position spaced apart from a display by a short distance.

In addition, the cover substrate 1000 may be partially bent to have a curved surface. That is, the cover substrate 1000 may have a partial flat surface and a partial curved surface. In detail, an end of the cover substrate 1000 may be bent to have a curved surface or may be bent or flexed to have a surface including a random curvature.

Further, the cover substrate 1000 may include a flexible substrate having a flexible property.

In addition, the cover substrate 1000 may be a curved or bended substrate. That is, a touch window having the cover substrate 1000 may be formed to have a flexible, curved or bended property. For this reason, the touch window according to the embodiment may be easily portable and may be variously changed in design.

The first resin layer 110 may be disposed on the cover substrate 1000. The first resin layer 110 may be an adhesive layer. That is, the first resin layer 110 may have an adhesive property. IN addition, the first resin layer 110 may be transparent. For example, the first resin layer 100 may be an optical clear adhesive (OCA) layer.

Thus, after the electrode is disposed on the cover substrate 1000 and the first resin layer 110, the cover substrate and the first resin layer may adhere to each other by using the adhesive strength of the first resin layer without any additional adhesive layers.

The first resin layer 110 may have a thickness in the range of about 1 μm to about 100 μm. In detail, the first resin layer 110 may have a thickness in the range of about 1 μm to about 25 μm. In more detail, the first resin layer 110 may have a thickness in the range of about 4 μm to about 25 μm.

It is difficult in terms of the fabrication process to implement the first resin layer 110 having a thickness less than about 1 μm and the process efficiency may be deteriorated. When the thickness of the first resin layer 110 exceeds about 25 μm, the overall thickness of the electrode member may be increased.

The sensing electrode and the wire electrode connected to the sensing electrode may be disposed on one surface of the cover substrate 1000 and one surface of the first resin layer 110.

For example, a first sensing electrode 310 and the first wire electrode may be disposed on one surface of the cover substrate 1000.

In addition, the second sensing electrode 320 and the second wire electrode may be disposed on one surface of the first resin layer 110 and an opposite surface to the one surface of the first resin layer 110 may adhere to the cover substrate 1000.

FIG. 5 is another sectional view of the first embodiment. Referring to FIG. 5, the touch window according to the first embodiment may include a cover substrate 1000, first and second resin layers 110 and 120, a sensing electrode 300 and a wire electrode.

In detail, the first resin layer 110 may be disposed on the cover substrate 1000 and the second resin layer 120 may be disposed on the first resin layer 110.

The second sensing electrode 320 and the second wire electrode may be disposed on the second resin layer 120.

The second sensing electrode 320 and the second wire electrode may be more easily disposed on the second resin layer 120 and the adhesive strength between the electrodes and the resin layer may be improved. Thus, the electrodes may be prevented from being delaminated.

The first and second resin layers 110 and 120 may include mutually different materials. The second resin layer 120 may include photo-curable resin or thermosetting resin. For example, the second resin layer 120 may include acrylic or urethane-based copolymer. For example, the second resin layer 120 may include UV resin.

The first and second resin layers 110 and 120 may have mutually different thicknesses. In detail, the second resin layer 120 may have a thickness thinner than that of the first resin layer 110.

For example, the second resin layer 120 may be disposed to have the thickness of about 10 μm. In detail, the second resin layer 120 may be disposed to have a thickness in the range of about 1 μm to about 10 μm. It may be difficult in terms of the fabrication process to allow the second resin layer 120 to be formed at a thickness less than about 1 μm, and when the thickness of the second resin layer 120 exceeds about 10 μm, the overall thickness of the electrode member may be increased.

FIG. 6 is still another sectional view of the first embodiment. Referring to FIG. 6, the touch window according to the first embodiment may include a cover substrate 1000, first and second resin layers 110 and 120, a sensing electrode 300 and a wire electrode 400, in which the sensing electrode 300 and the wire electrode may be disposed only on the second resin layer.

In detail, the first resin layer 110 may be disposed on the cover substrate 100 and the second resin layer 120 may be disposed on one surface and the opposite surface of the first resin layer 110. The sensing electrode 300 and the wire electrode may be disposed on one surface and the opposite surface of the first resin layer 110. In detail, the sensing electrode 300 and the wire electrode may be disposed on the second resin layer 120 on one surface and the opposite surface of the first resin layer 110.

Thus, after the electrode is disposed on the first resin layer 110, the cover substrate and the first and second resin layers may adhere to each other by using the adhesive strengths of the first and second resin layers without any additional adhesive layers.

The sensing and wire electrodes may include a material the same as or similar to that of the electrode layer of the electrode member. In addition, at least one of the sensing and wire electrodes may include a mesh shape.

Hereinafter, the touch window according to the second embodiment will be described in detail with reference to FIGS. 7 and 8. In the following description of the touch window according to the second embodiment, description about elements and structures the same as or similar to those of the touch window according to the first embodiment described above will be omitted. In addition, the same reference numerals will be assigned to the elements the same as those of the first embodiment.

Referring to FIGS. 7 and 8, a touch window according to the second embodiment may include a cover substrate 1000, a first resin layer 110, a sensing electrode 310 and 320, and a wire electrode.

Referring to FIG. 7, differently from the first embodiment, the first and second sensing electrodes 310 and 320 and the first and second wire electrodes of the touch window according to the second embodiment may be disposed on one surface of the first resin layer 110.

That is, the first and second sensing electrodes 310 and 320 of the touch window according to the second embodiment may be disposed on the same surface of the resin layer 110.

Thus, the overall thickness of the touch window may be reduced.

FIG. 8 is another sectional view of the second embodiment. Referring to FIG. 8, the touch window according to the second embodiment may further include the second resin layer 120 on the first resin layer 110.

In addition, the first and second sensing electrodes 310 and 320 and the first and second wire electrodes may be disposed on one surface of the second resin layer 120. That is, the first and second sensing electrodes 310 and 320 may be disposed on the same surface of the second resin layer 120.

Thus, the overall thickness of the touch window may be reduced.

Since the thicknesses and materials of the first and second resin layers, the shape of the electrodes and the material of the cover substrate are the same as or similar to those of the touch window according to the first embodiment, the details will be described below.

Hereinafter, the touch window according to the third embodiment will be described in detail with reference to FIGS. 9 and 10. In the following description of the touch window according to the third embodiment, description about elements and structures the same as or similar to those of the touch windows according to the first and second embodiments described above will be omitted. In addition, the same reference numerals will be assigned to the elements the same as those of the first and second embodiments.

Referring to FIG. 9, the touch window according to the fourth embodiment may include a cover substrate 1000, a third resin layer 110a, a fourth resin layer 110b, sensing electrodes 310 and 320, and a wire electrode.

Differently from the first embodiment, the touch window of the fourth embodiment may include the third and fourth resin layers 110a and 110b.

The third resin layer 110a may be disposed on the cover substrate 1000 and the fourth resin layer 110b may be disposed on the third resin layer 110a.

A first sensing electrode 310 and a first wire electrode may be disposed on one surface of the third resin layer 110a, and a second sensing electrode 320 and a second wire electrode may be disposed on one surface of the fourth resin layer 110b.

FIG. 10 is another sectional view of the fourth embodiment. Referring to FIG. 10, the touch window according to the fourth embodiment may further include fifth and sixth resin layers 120a and 120b.

In detail, the touch window according to the embodiment may further include the fifth resin layer 120a on the third resin layer 110a and the sixth resin layer 120b on the fourth resin layer 110b.

The third resin layer 110a may be disposed on the cover substrate 1000. In addition, the first sensing electrode 310 and the first wire electrode may be disposed on the fifth resin layer 120a.

In addition, the fourth resin layer 110b may be disposed on the fifth resin layer 120a. Further, the second sensing electrode 320 and the second wire electrode may be disposed on the sixth resin layer 120b.

Since the thicknesses and materials of the third to sixth resin layers, the shape of the electrodes and the material of the cover substrate are the same as or similar to those of the touch window according to the first embodiment, the details will be described below.

The overall thickness of each of the touch windows according to the embodiments may be reduced. That is, after a substrate for supporting the electrode is removed, the electrode is directly disposed on the first resin layer having an adhesive property, or after the second resin layer for supporting the electrode is disposed on the first resin layer, the electrode is disposed on the second resin layer, so that the overall thickness of the touch window according to the embodiment may be reduced as much as the thickness of the removed substrate.

Thus, the overall thickness of the touch window according to the embodiment may be reduced, so that the size restriction in the touch device to which the touch window is applied may be relieved, thereby implementing a touch device having a lighter weight and a thinner thickness.

Hereinafter, a touch device in which the touch window and the display panel according to the embodiment described above will be described with reference to FIG. 11.

Referring to FIG. 11, the touch device according to the embodiment may include the touch window formed integrally with the display panel 700. That is, the resin layer supporting at least one sensing electrode may be omitted.

In detail, at least one sensing electrode may be formed on at least one surface of the display panel 700. The display panel 700 includes the first and second substrates 701 and 702. That is, at least one sensing electrode may be formed on at least one surface of the first or second substrate 701 or 702.

If the display panel 700 is a liquid crystal display panel, the display panel 700 may have a structure in which the first substrate 701 including a thin film transistor (TFT) and a pixel electrode is combined with the second substrate 702 including color filter layers while a liquid crystal layer is interposed between the first and second substrates 701 and 702.

In addition, the display panel 700 may be a liquid crystal display panel having a color filter on transistor (COT) structure formed by combining the first substrate 701 formed thereon with the TFT, a color filter, and a black matrix with the second substrate 702 while the liquid crystal layer is interposed between the first and second substrates 701 and 702. In other words, the TFT may be formed on the first substrate 701, a protective layer may be formed on the TFT, and the color filter layer may be formed on the protective layer. In addition, the pixel electrode, which makes contact with the TFT, is formed on the first substrate 701. In this case, to improve an aperture ratio and simplify a mask process, the black matrix may be omitted, and a common electrode may perform a function of the black matrix together with the inherent function thereof.

In addition, when the display panel 700 is a liquid crystal panel, the display device may further include a backlight unit for supplying light onto a rear surface of the display panel 700.

When the display panel 700 is an organic light emitting device, the display panel 700 includes a self light-emitting device which does not require any additional light sources. A thin film transistor is formed on the first substrate 701 of the display panel 700, and an organic light-emitting device (OLED) making contact with the thin film transistor is formed. The OLED may include an anode, a cathode and an organic light-emitting layer formed between the anode and the cathode. In addition, the display panel 700 may further include the second substrate 702, which performs the function of an encapsulation substrate for encapsulation, on the OLED.

In this case, at least one sensing electrode may be formed on the top surface of one substrate disposed on another substrate. Although the sensing electrode formed on the top surface of the second substrate 702 is depicted in the drawings, if the first substrate 701 is disposed on the second substrate 702, the at least one sensing electrode may be formed on the top surface of the first substrate 701.

Referring to FIG. 11, the first sensing electrode 310 may be formed on the top surface of the display panel 700. In addition, a first wire connected to the first sensing electrode 310 may be formed. The second sensing electrode 320 and the first resin layer 110 in which a second wire is formed may be formed on the display panel 700. The first resin layer may adhere to the display panel 700. Although the first resin layer 110 is only depicted in FIG. 11, the embodiment is not limited thereto and the second resin layer 120 described above may be further disposed on the first resin layer 110.

Although the second sensing electrode 320 formed on the top surface of the first resin layer 110 and the cover substrate 1000 disposed on the first resin layer 110 while interposing an adhesive layer 67 therebetween, are depicted in the drawings, the embodiment is not limited thereto. The second sensing electrode 320 may be formed on the rear surface of the first resin layer 110.

That is, the embodiment is not limited to the drawings, and it is sufficient if the first resin layer 110 supporting the second sensing electrode 320 is disposed on the display panel 700 and the first resin layer 110 is combined with the display panel 700.

In addition, a polarizing plate may be further disposed below the first resin layer 110. For example, the polarizing plate may be interposed between the first resin layer 110 and the display panel 700. In addition, the polarizing plate may be disposed on the first resin layer 110.

The polarizing plate may be a linear polarizing plate or an anti-reflection polarizing plate. For example, when the display panel 700 is a liquid crystal display panel, the polarizing plate may be a linear polarizing plate. In addition, when the display panel 700 is an organic electroluminescent display panel, the polarizing plate may be an anti-reflection polarizing plate.

Although the sensing electrode disposed on the display panel 700 is depicted in FIG. 11, the embodiment is not limited thereto and the first and second sensing electrodes 310 and 320 may be disposed on one surface of the first resin layer 110 and the opposite surface or the same one surface of the first resin layer 110.

Hereinafter, one example of a touch device, to which the touch window according to the embodiment described above is applied, will be described with reference to FIGS. 12 to 15.

Referring to FIG. 12, there is shown a mobile terminal as one example of the touch device. The mobile terminal 1000 may include an active area AA and an unactive area UA. The active area AA may sense a touch signal when a finger touches the active area AA, and an instruction icon pattern part and a logo may be formed in the unactive area UA.

Referring to FIG. 13, the touch window may include a flexible touch window. Thus, a touch device including it may be a flexible touch device. Therefore, a user may flex or bend the touch device with his hand Referring to FIG. 14, the touch window may be applied to a vehicle navigation system as well as the touch device of a mobile terminal.

In addition, referring to FIG. 15, the touch panel may be applied to an inner part of a vehicle. In other words, the touch panel may be applied to various parts in the vehicle. Accordingly, the touch panel may be applied to a dashboard as well as a PND (Personal Navigation Display), so that a CID (Center Information Display) may be realized. However, the embodiment is not limited to the above, and the touch device may be used for various electronic appliances.

Furthermore, the touch device according to the embodiment may be applied to a wearable touch device such as a clock or glasses and may be attached to shoes to implement smart shoes or clothes.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A touch window comprising:
a cover that receives touches for touch inputs;
a resin layer under the cover; and
an electrode layer under the first resin layer, the first resin layer configured to
provide structural support for the electrode layer, and
bond the electrode layer onto the cover,
wherein the electrode layer includes a sensing electrode and a wire electrode,
wherein the cover is in direct physical contact with the resin layer and disposed on a touch side of the touch window relative to the electrode layer,
wherein a top surface of the resin layer is in direct physical contact with the cover, and a bottom surface of the resin layer is in direct physical contact with the sensing electrode and the wire electrode,
wherein a width of the cover corresponds to a width of the first resin layer,
wherein the cover does not directly contact the electrode layer, and
wherein the resin layer has a thickness in a range of 1 μm to 25 μm,
wherein the electrode layer and the bottom surface of the resin layer are configured to be disposed on an external device.

2. The touch window of claim 1, wherein the resin layer includes an adhesive layer.

3. The touch window of claim 1, wherein a thickness of the resin layer in a range of 4 μm to 25 μm.

4. The touch window of claim 1, wherein the resin layer includes a first resin layer and a second resin layer interposed between the first resin layer and the electrode layer,
wherein the first resin layer has a thickness thicker than a thickness of the second resin layer.

5. The touch window of claim 4, wherein the thickness of the second resin layer is in a range of 1 μm to 10 μm.

6. The touch window of claim 4, wherein the first and second resin layers comprise mutually different materials.

7. The touch window of claim 4, wherein a width of the second resin layer corresponds to a width of the first resin layer and the cover.

8. The touch window of claim 4, wherein the sensing electrode and the wire electrode are only disposed on a bottom surface of the second resin layer.

9. The touch window of claim 4, wherein a top surface of the second resin layer is in direct physical contact with the first resin layer, and a bottom surface of the second resin layer is in direct physical contact with the sensing electrode and the wire electrode.

10. The touch window of claim 4, wherein the second resin layer has a strength higher than a strength of the first resin layer.

11. The touch window of claim 1, wherein at least one of the sensing and wire electrodes has a mesh shape.

12. The touch window of claim 1, wherein the sensing electrode includes a first sensing electrode and a second sensing electrode,
wherein the first sensing electrode and the second sensing electrode are disposed on the same surface of the resin layer.

13. A touch device having a touch window according to claim 1, and the touch device further includes a display panel under the touch window.

14. The touch window of claim 1, wherein the sensing electrode and the wire electrode are only disposed on a bottom surface of the first resin layer.

15. The touch window of claim 1, wherein the cover includes a glass.

16. The touch window of claim 1, wherein the cover has a partial flat surface and a partial curved surface, and an end of the cover is bent to have a curved surface.

17. The touch window of claim 1, wherein the sensing and wire electrodes include a mesh line and a mesh opening,
wherein a line width of the mesh line is in the range of 0.1 μm to 10 μm
wherein the mesh line has a thickness in the range of 100 nm to 500 nm.

18. The touch window of claim 1, wherein the second resin layer is not in contact with the cover.

* * * * *